United States Patent [19]
Kanno et al.

[11] Patent Number: 5,535,220
[45] Date of Patent: Jul. 9, 1996

[54] FORWARD ERROR CORRECTING TRANSMITTER AND RECEIVER

[75] Inventors: Ippei Kanno; Seiji Sakashita, both of Hirakata; Hiroaki Ozeki, Neyagawa; Daisuke Hayashi, Osaka; Todd S. Bowser, Itami, all of Japan

[73] Assignee: Matsushita Electric Industrial Co., Ltd., Osaka, Japan

[21] Appl. No.: 182,830

[22] Filed: Jan. 19, 1994

[30] Foreign Application Priority Data

Jan. 19, 1993 [JP] Japan .................................... 5-006774

[51] Int. Cl.⁶ .................................................. G06F 11/00
[52] U.S. Cl. ................................... 371/2.1; 370/107
[58] Field of Search ........................... 371/2.1, 40.1, 371/2.2, 38.1, 43, 44; 370/107, 99, 114

[56] References Cited

U.S. PATENT DOCUMENTS

| | | | |
|---|---|---|---|
| 5,042,033 | 8/1991 | Costa | 371/2.1 |
| 5,239,623 | 8/1993 | Sato et al. | 395/119 |
| 5,285,458 | 2/1994 | Yoshida | 371/2.1 |
| 5,309,450 | 5/1994 | Kim | 371/2.1 |
| 5,313,464 | 5/1994 | Reiff | 371/2.1 |
| 5,384,782 | 1/1995 | Elms | 371/2.1 |

FOREIGN PATENT DOCUMENTS

| | | |
|---|---|---|
| 2592258 | 6/1987 | France . |
| 57-113656 | 7/1982 | Japan . |
| 58-181348 | 10/1983 | Japan . |
| 63-181539 | 7/1988 | Japan . |
| WO-A-91/12611 | 8/1991 | WIPO . |

OTHER PUBLICATIONS

Electronics Letters, vol. 25, No. 22, Oct. 26, 1989, E. Dunscombe/F. C. Piper, "Optimal Interleaving Scheme for Convolutional Coding", pp. 1517, 1518.

Milcom '89, 1989 IEEE Military Communications Conference Oct. 15–18, 1989 Boston, Mass., "A New Pseudo–Random Interleaving for Antijamming Applications", M. M. Darmon/P. R. Sadot, pp. 6, 7, 9.

Primary Examiner—Emanuel T. Voeltz
Assistant Examiner—Thomas Peeso
Attorney, Agent, or Firm—Wenderoth, Lind & Ponack

[57] ABSTRACT

A forward error correcting transmitter and receiver for preventing the erroneous detection of synchronization is provided in a system in which synchronization of an interleaver circuit and a deinterleaver circuit, to be inserted between a convolutional encoder and a Viterbi decoder, is obtained from a synchronization detecting circuit of the Viterbi decoder. A LFSR (Linear Feedback Shift Register) is used as a row-direction address counter during writing and an up/down counter is used as a column-direction address counter during reading, during the interleaver circuit. In the deinterleaver circuit, an up/down counter is used as the column-direction address counter during writing, and an LFSR is used as the row-direction address counter during reading.

6 Claims, 8 Drawing Sheets

BEFORE INTERLEAVING

| 1 | 2 | 3 | 4 | 5 | 6 | 7 | 8 | 9 | - - - | 20 | 21 | 22 | 23 | 24 | 25 | 26 | 27 | 28 |

⇩

WRITE

INTERLEAVER CIRCUIT

READ

| 1 | 7 | 6 | 4 | 2 | 5 | 3 |
| 8 | 14 | 13 | 11 | 9 | 12 | 10 |
| 15 | 21 | 20 | 18 | 16 | 19 | 17 |
| 22 | 28 | 27 | 25 | 23 | 26 | 24 |

⇩

TRANSMISSION

|  |  |  |  | 1 | 8 | 15 | 22 | 28 | - - - | 23 | 26 | 19 | 12 | 5 | 3 | 10 | 17 | 24 |

⇩

READ

DEINTERLEAVER CIRCUIT

WRITE

|  | 22 | 28 | 27 | 25 | 23 | 26 |
|  | 15 | 21 | 20 | 18 | 16 | 19 |
|  | 8 | 14 | 13 | 11 | 9 | 12 |
|  | 1 | 7 | 6 | 4 | 2 | 5 |

⇩

AFTER DEINTERLEAVING

|  | 25 | 26 | 27 | 23 | 28 | 22 |  | 18 | - - - | 14 | 8 |  | 4 | 5 | 6 | 2 | 7 | 1 |

FIG. 6

BEFORE INTERLEAVING

| 1 | 2 | 3 | 4 | 5 | 6 | 7 | 8 | 9 | - - - | 20 | 21 | 22 | 23 | 24 | 25 | 26 | 27 | 28 |

⇩

WRITE

INTERLEAVER CIRCUIT

READ

| 1 | 2 | 3 | 4 | 5 | 6 | 7 |
| 8 | 9 | 10 | 11 | 12 | 13 | 14 |
| 15 | 16 | 17 | 18 | 19 | 20 | 21 |
| 22 | 23 | 24 | 25 | 26 | 27 | 28 |

⇩

TRANSMISSION

| Δ | 1 | 8 | 15 | 22 | 23 | 16 | 9 | 2 | 3 | - - - | 26 | 27 | 20 | 13 | 6 | 7 | 14 | 21 | 28 |

⇩

READ

DEINTERLEAVER CIRCUIT

WRITE

| Δ | 9 | 2 | 11 | 4 | 13 | 6 |
| 1 | 16 | 3 | 18 | 5 | 20 | 7 |
| 8 | 23 | 10 | 25 | 12 | 27 | 14 |
| 15 | 22 | 17 | 24 | 19 | 26 | 21 |

⇩

AFTER DEINTERLEAVING

| Δ | 9 | 2 | 11 | 4 | 13 | 6 | 1 | 16 | - - - | 27 | 14 | 15 | 22 | 17 | 24 | 19 | 26 | 21 |

FIG. 7

BEFORE INTERLEAVING

| 1 | 2 | 3 | 4 | 5 | 6 | 7 | 8 | 9 | - - - | 20 | 21 | 22 | 23 | 24 | 25 | 26 | 27 | 28 |

⇩

WRITE

INTERLEAVER CIRCUIT

READ

| 1 | 2 | 3 | 4 | 5 | 6 | 7 |
| 8 | 9 | 10 | 11 | 12 | 13 | 14 |
| 15 | 16 | 17 | 18 | 19 | 20 | 21 |
| 22 | 23 | 24 | 25 | 26 | 27 | 28 |

⇩

TRANSMISSION

| △ | △ | △ | △ | 1 | 8 | 15 | 22 | 23 | - - - | 26 | 27 | 20 | 13 | 6 | 7 | 14 | 21 | 28 |

⇩

READ

DEINTERLEAVER CIRCUIT

WRITE

| △ | 22 | 23 | 24 | 25 | 26 | 27 |
| △ | 15 | 16 | 17 | 18 | 19 | 20 |
| △ | 8 | 9 | 10 | 11 | 12 | 13 |
| △ | 1 | 2 | 3 | 4 | 5 | 6 |

⇩

AFTER DEINTERLEAVING

| △ | 22 | 23 | 24 | 25 | 26 | 27 | △ | 15 | - - - | 12 | 13 | △ | 1 | 2 | 3 | 4 | 5 | 6 |

FIG. 8
*PRIOR ART*

BEFORE INTERLEAVING

| 1 | 2 | 3 | 4 | 5 | 6 | 7 | 8 | 9 | - - - | 20 | 21 | 22 | 23 | 24 | 25 | 26 | 27 | 28 |

⇩

INTERLEAVER CIRCUIT

WRITE →

| 1 | 2 | 3 | 4 | 5 | 6 | 7 |
|---|---|---|---|---|---|---|
| 8 | 9 | 10 | 11 | 12 | 13 | 14 |
| 15 | 16 | 17 | 18 | 19 | 20 | 21 |
| 22 | 23 | 24 | 25 | 26 | 27 | 28 |

READ ↓

⇩

TRANSMISSION

| Δ | 1 | 8 | 15 | 22 | 2 | 9 | 16 | 23 | 3 | - - - | 26 | 6 | 13 | 20 | 27 | 7 | 14 | 21 | 28 |

⇩

DEINTERLEAVER CIRCUIT

READ →

| Δ | 22 | 23 | 24 | 25 | 26 | 27 |
|---|----|----|----|----|----|----|
| 1 | 2 | 3 | 4 | 5 | 6 | 7 |
| 8 | 9 | 10 | 11 | 12 | 13 | 14 |
| 15 | 16 | 17 | 18 | 19 | 20 | 21 |

WRITE ↓

⇩

AFTER DEINTERLEAVING

| Δ | 22 | 23 | 24 | 25 | 26 | 27 | 1 | 2 | - - - | 13 | 14 | 15 | 16 | 17 | 18 | 19 | 20 | 21 |

# FORWARD ERROR CORRECTING TRANSMITTER AND RECEIVER

BACKGROUND OF THE INVENTION

1. FIELD OF THE INVENTION

The present invention relates to forward error correcting transmitter and receiver used for digital transmission such as multiphase PSK (Phase Shift Keying) and multi-value QAM (Quadrature Amplitude Modulation).

2. DESCRIPTION OF PRIOR ART

Along with the recent progress of band compression technology of image signals through digital signal processing, transmission of digital data is now being used not only in the communications area but also widely used in the broadcasting area, and a forward error correcting apparatus for digital transmission such as QPSK (Quadrature Phase Shift Keying) and 16QAM has become essential technology.

The conventional forward error corrector is composed of a transmitter for transmitting digital signals and a receiver for receiving thus transmitted digital signals.

The transmitter comprises a convolution encoder which converts an input digital signal to be transmitted into a forward error corrected code, an interleaver circuit which changes a sequence of output data within each predetermined block length, and a digital modulator which modulates an output of the interleaver circuit.

The receiver comprises a digital demodulator which demodulates a received digital signal, a block phase control circuit which controls a block partition of the demodulated digital signal, a deinterleaver circuit which releases interleaving effected on the transmitting side, and a Viterbi decoder which conducts forward error correcting decoding. A synchronization detecting circuit which detects the synchronization of codes is connected to the Viterbi decoder; the block phase control circuit is controlled on the basis of the results of the code synchronization detection.

In the transmitter, the interleaver circuit sequentially writes digital signals, converted into forward error correction codes by the convolution encoder in the row direction, into memories which are arranged, for example so as to consist of seven memories in the row direction and four in the column direction and then, the interleaver circuit sequentially reads out data written into the memories in the column direction (see FIG. 8). The read-out data are modulated by the digital modulator, and transmitted to the transmission line.

Then, in the receiver, the transmitted digital modulated signal is demodulated by the digital demodulator and is input to the block phase control circuit. When a code is determined not to be in synchronization with a certain integral period in the synchronization detecting circuit, the block phase control circuit causes a shift for one symbol of the partition of deinterleaved block. This shift is continued until code synchronization is confirmed, and upon determination of synchronization, then block partition is kept. This utilizes the fact that disagreement between the block partition interleaved on the transmission side and the block partition to be deinterleaved on the receiving side makes it impossible to achieve synchronization of the Viterbi decoder.

Thus, an interleaved block partition is found on the receiving side using the synchronization detecting circuit, so as to cause deinterleaving for each block partition, and forward error correcting decoding is accomplished by the Veterbi decoder (for example, see Japanese Laid-Open Patent Publication No. 3-32, 131; for code synchronization, see, for example: Yasuda et al. "Code Synchronizing Method in Viterbi Decoding," The Transaction of the Institute of the Electronics Information and Communication Engineers, (B), vol. J66-B, No. 5, pp. 623–630 (May 1983)).

In the configuration as described above, however, data columns before interleaving remain at many points even when interleaving has been accomplished at a wrong block partition as shown in FIG. 8, and another problem is the possibility of erroneous synchronization detection in the synchronization detecting circuit.

SUMMARY OF THE INVENTION

An object of the present invention is therefore to provide forward error correcting transmitter and receiver which take into account the above-mentioned problems in the conventional forward error corrector and prevent the erroneous detection of synchronization.

To achieve the object, the forward error correcting transmitter of the present invention comprises: an error correcting encoder for error-correcting-encoding a digital signal to obtain an error-correcting-encoded signal; an interleaver comprising a memory which is composed of rows and columns and permits the reading and writing of said error-correcting-encoded signal, and a memory controller which controls said memory, when writing in said memory, so as to write said error-correcting-encoded signal on row by row basis in a predetermined random sequence in each row, and controls said memory, when reading out from said memory, so as to read out said error-correcting-encoded signal written in said memory in one direction in each column, alternately reversing the direction on a column by column basis; a modulator which modulates said error-correcting-encoded signal read out from said memory to obtain a modulated signal; and a transmitter for providing a transmitted signal from said modulated signal.

The forward error correcting receiver of the present invention comprises: a receiver which receives a transmitted signal; a demodulator which demodulates said transmitted signal to obtain an input signal; an deinterleaver comprising a memory which composed of rows and columns and permits the reading and writing of said input signal, and a memory controller which controls said memory, when writing into said memory, so as to write said input signal in one direction in each column, alternately reversing the direction on a column by column basis, and controls said memory, when reading out from said memory, so as to read out said input signal on a row by row basis in a predetermined random sequence in each row; an error correcting decoder for error-correcting-decoding said input signal read out from said memory; and a synchronization detector which detects the synchronization of said input signal to be error-correcting-decoded.

In the forward error correcting transmitter of the present invention, by the configuration as described above, the error correcting encoder converts a digital signal into an error-correcting-encoded signal, the interleaver writes the error-correcting-encoded signal into the memory the error-correcting-encoded signal into the in accordance with a row-direction address based a previously determined random number, and reads the error-correcting-encoded signal written in the memory out of the memory in the column direction, and reads out the signal, when switching over to the next column, in the reverse direction, and the modulator provides a signal read out from the memory as an output.

In the forward error correcting receiver of the present invention, the demodulator demodulates the transmitted signal, and the deinterleaver writes in the input signal, when writing in the memory, in the column direction, and writes in the input signal, when switching over to the next column, in the reverse direction, and reads out the input signal written in memory, when reading out from the memory, in accordance with a row-direction address based on the predetermined random numbers; the error correcting decoder error-correcting-decodes the input signal read out from the memory; and the synchronization detector detects the synchronization of the input signal to be error-correcting-decoded.

According to the present invention, deinterleaving at a wrong block partition causes breakage and diffusion of the original data array, thus preventing and erroneous detection of the synchronization upon decoding the error-correcting-encoded signal.

BRIEF DESCRIPTION OF THE DRAWINGS

FIG. 6 is a descriptive view of the functions of the interleaver circuit and the deinterleaver circuit in accordance with another embodiment of the present invention;

FIG. 7 is a descriptive view of the functions of the interleaver circuit and the deinterleaver circuit in accordance with a further embodiment of the present invention; and FIG. 8 is a descriptive view of the functions of the interleaver circuit and a deinterleaver circuit of the conventional apparatus.

DESCRIPTION OF PREFERRED EMBODIMENTS

Now, the present invention will be described with reference to the drawings.

Figure 1:
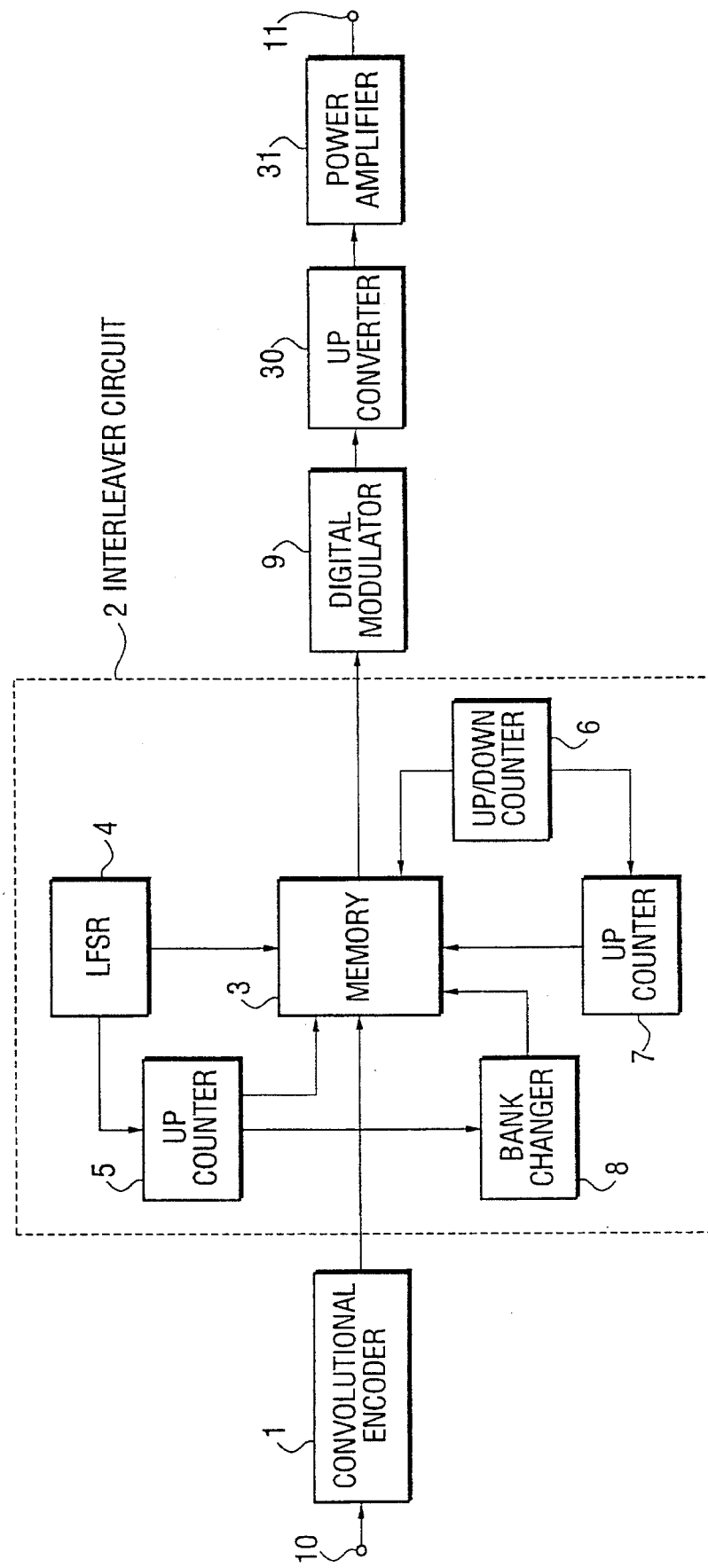
FIG. 1 is a block diagram of a forward error correcting transmitter of an embodiment in accordance with the present invention.
Figure 2:
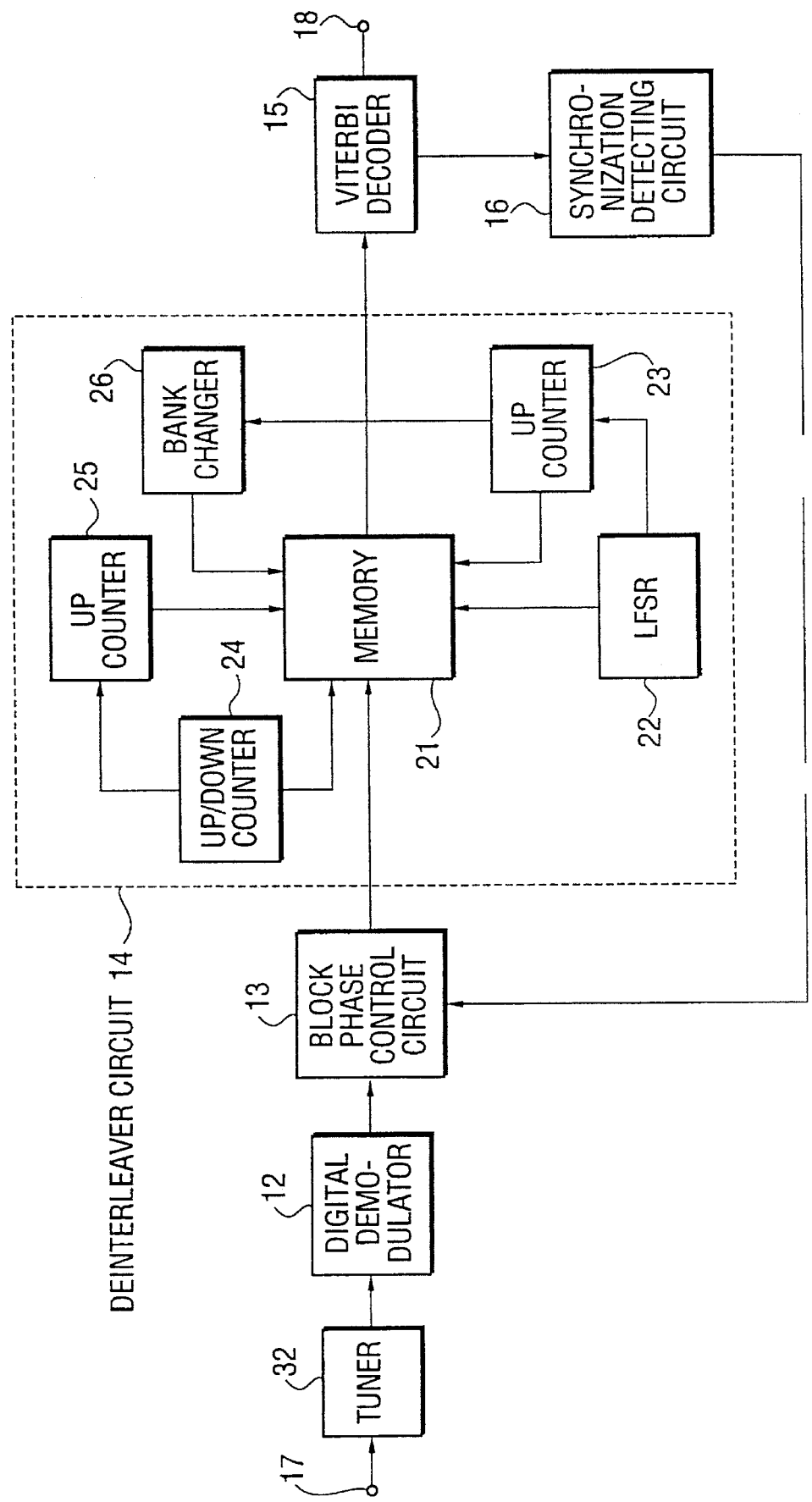
FIG. 2 is a block diagram of a forward error correcting receiver in accordance with an embodiment of the present invention.

FIG. 1 is a block diagram of a forward error correcting transmitter in accordance with an embodiment of the present invention, and FIG. 2 is a block diagram of a forward error correcting receiver in accordance with an embodiment of the present invention. A forward error corrector is composed of the forward error correcting transmitter and the forward error correcting receiver.

The forward error correcting transmitter shown in FIG. 1 is provided with an input terminal 10 for receiving a digital signal to be transmitted; and a convolutional encoder 1, for converting the digital signal into an error-correcting-encoded signal, is connected to the input terminal 10. An interleaver circuit 2, which changes a sequence data within a block for each of predetermined block length, is connected to this convolutional encoder 1. A digital modulator 9, for modulating a digital signal, is connected to the interleaver circuit 2. An output of the digital modulator 9 is connected to an output terminal 11 though an Up converter 30 and power amplifier 31.

The interleaver circuit 2 is provided with a 2-port type memory 3, permitting-simultaneous reading and writing, and composed of rows and columns. The memory 3 is composed of two banks of two-dimensional memories expressed by m×n, having in general a size of (m×n)×2. In other words, during writing in one bank, data of the immediately preceding block already written in are read out from the other bank, and at the point when processing has reached the full memory size, write and read are conducted in succession by switching over the bank. An LFSR (Linear Feedback Shift Register) 4 for providing a row-direction address when writing data from the convolutional encoder 1, an up counter 5 for providing a column-direction address, and a bank changer 8 are connected to the memory 3. In addition, an up/down counter 6 for providing a row- direction address when reading out and an up counter 7 for providing a row-direction address are connected to the memory 3.

The forward error correcting receiver shown in FIG. 2 is, on the other hand, provided with an input terminal 17 for receiving a digital modulated signal a digital demodulator 12 for demodulating the digital modulated wave is connected to the input terminal 17 through a tuner 32. A block phase control circuit 13 for changing the block partition of an input signal is connected to this digital demodulator 12. A deinterleaver circuit 14 for releasing the interleaving of data is connected to this block phase control circuit 13, and a Viterbi decoder 15 for decoding the error-correcting-encoded signal is connected to this deinterleaver circuit 14. An output terminal 18 for providing a decoded signal as an output and a synchronization detecting circuit 16 for detecting code synchronization are connected to the Viterbi decoder 15, and the output of this synchronization detecting circuit 16 is connected to the block phase control circuit 13.

A 2-port type memory 21 for permitting simultaneous reading and writing is composed of rows and columns and is provided in the deinterleaver circuit 14, as in the interleaver circuit 2. The memory 21 has in general a size (m×n)×2 and is composed of two banks of two-dimensional memory expressed by m×n. An up/down counter 24 for providing a column-direction address when writing in data from the block phase control circuit 13, and an up counter 25 for providing a row-direction address are connected to the memory 21. In addition, an LFSR 22 for providing a row-direction address when reading out data, an up counter 23 for providing a column-direction address, and a bank changer 26 are connected to the memory 21. For the LFSRs 4 and 22 used for the interleaver circuit 2 and the deinterleaver circuit 14, the same generator polynominal must be employed. Because the LFSR can give a native initial value by means of a reset signal, it is possible to perform the same operations on the interleaving and deinterleaving sides.

At this point, the convolutional encoder 1 conducts error correcting encoding, and the Viterbi decoder 15 conducts error correcting decoding.

Figure 5:
FIG. 5 is a descriptive view of the functions of a interleaver circuit and a deinterleaver circuit in accordance with one embodiment of the present invention.
Figure 5:
Figure 5:
Figure 5:
Figure 5:
Figure 5:
Figure 5:
Figure 5:
Figure 5:
Figure 5:
Figure 5:

Now, the operations of the forward error corrector configured as described above will be described. First, in the forward error correcting transmitter, the digital signal is encoded into an error-corrected code, and this signal is interleaved by the interleaver circuit 2. This interleaving writes data in the row direction through a first port set on the write port into the memory 3 composed of seven row-direction memories and four column-direction memories, as shown in FIG. 5, for example. This row-direction address during writing is provided by random numbers generated by the LFSR 4, and when a row is filled fully with data, the up counter 5 increases the column-direction addresses by one, which is given as the column-direction address.

Furthermore, the bank changer 8 detects completion of writing into the m×n memory areas under the effect of a carry signal of the up counter 5, and performs bank switchover by reversing the MSB (Most Significant Bit) of the addresses in the memory 3.

Then, the thus written data is read out through a second port set on the read-out port of the memory 3. The column-direction address during this reading out operation is given by the up/down counter 6, and the row-direction address is provided by the up counter 7. The data is read out sequentially in the column-direction, and when switching over to the next column, in the reverse direction. The data outputted from the interleaver circuit 2 is digital-modulated (such as PSK, QAM, etc.) in a predetermined intermediate frequency band by the digital modulator 9. After the data outputted from the digital modulator 9 is up converted by an up converter 30, the data is amplified to a predetermined transmitting power by a power amplifier 31, and transmitted to a transmission line from an output terminal 11.

In the forward error correcting receiver, the transmitted signals inputted to the input terminal 17 are selected and down converted to the predetermined intermediate frequency band in a tuner 32. Signals outputted from the tuner are demodulated in the digital demodulator 12 and restored as digital data by being identified at a threshold level. The digital data is sent to the block phase control circuit 13. The synchronization detecting circuit 16 determines, for each block partition of the deinterleaver circuit 14, whether or not detection of synchronization at the Viterbi decoder 15 is successful, and in the case of an unsuccessful detection, the block partition of the block phase control circuit 13 is changed by one symbol (corresponding to one clock) to another direction. The block phase control circuit 13 can be operated by using it continuously in using a memory capable of reading and writing. More specifically, writing and reading are performed in succession, and the block partition is shifted by changing the amount of delay by sequentially changing the difference between the write address and the read address.

Then, the output from the block phase control circuit 13 is input to the deinterleaver circuit 14. The processing in the deinterleaver circuit 14 forms a pair with that in the interleaver circuit 2. The signal input to the deinterleaver circuit 14 is written in through the first port of the memory 21 set on the write port. A column-direction address for this writing is given by the up/down counter 24, and a row-direction address, by the up counter 25. Signals are sequentially written in the column direction, and when switching over to the next column, are written in the reverse direction. Then, data is read out in the row direction through the second port set on the readout port of the memory 21. The row-direction address in this reading is given by random numbers generated by the LFSR 22, and when an entire row is fully filled with data, the up counter 23 increases the column-direction address by one, and this address is provided as the column-direction address.

Furthermore, completion of readout of the m×n memory areas is detected by means of a carry signal of the up counter 23, and the bank changer 26 performs bank switchover by reversing MSB of the address of the memory 21.

Data whose sequence has been altered by interleaving on the transmitting side, when being deinterleaved at a proper data partition by the deinterleaver circuit 14, returns to the original data column before interleaving and enters the Viterbi decoder 15. The Viterbi decoder 15 conducts Viterbi decoding of an entered data column and sends the result as an output to the output terminal 18. To ensure detection and maintenance of synchronization even through a robust transmission line, the synchronization detecting circuit 16 determines whether or not detection of synchronization is successful by monitoring the data for a certain period of time, i.e., monitoring a certain number of pieces of the data. If the memory area is assumed to have a block size of m×n, it is necessary, in order for the synchronization detecting circuit 16 to make such a determination within a block, that a monitoring time of the Viterbi decoder 15 should be set so as to be smaller than m×n.

Now, the following paragraphs explain that, in the deinterleaver circuit 14 of the above-mentioned embodiment, deinterleaving at a position other than the proper data partition causes breakage and diffusion of the original data column, thus making detection of synchronization unsuccessful in the synchronization detecting circuit 16.

FIGS. 5 and 8 illustrate the data column sequentially before interleaving, in the interleaver circuit, in the transmission line, in the deinterleaver circuit, and then after deinterleaving. For simplicity, the two-dimensional memories used in the interleaver circuit 2 and the deinterleaver circuit 14 comprise 7×4 memory spaces arranged seven memories in the row direction and four memories in the column direction. The addresses begin with 0 for both rows and columns, and the origin of the address is located upper left of a memory space.

FIG. 8 illustrates a conventional case using ordinary up counters for both the row direction and the column direction, in which deinterleaving is conducted at a position off the proper data partition by one symbol. As is clear from the result after deinterleaving, the data column before interleaving is maintained to some extent, so that erroneous detection of synchronization is highly probable in the synchronization detecting circuit 16.

FIG. 5 illustrates a case where an up/down counter 24 is used as the column-direction counter during writing of the deinterleaver circuit 14, and an LFSR 22 is used as the row-direction counter during reading. In this case, a generator polynominal $X^3+X^2+1$ is assumed for the LFSR. The count value varies in a period of seven digits from 0 to 4, 6, 3, 5, 2, 1, and then 0. In general, an LFSR 22 composed of a generator polynominal having a degree of n has a period of $2^n-1$. FIG. 5 covers the case of deinterleaving at a position off the proper data partition by one column: since the original data column is broken and diffused as a result of deinterleaving, there is no possibility that erroneous detection of synchronization could be successful in the synchronization detecting circuit 16.

According to this embodiment, as described above, the original data column is not broken but returns to the original state only when conducting deinterleaving at the proper data partition, by using a configuration in which the up/down counter 24 is used as the column-direction address counter when writing into the memory for the deinterleaver circuit, and using the LFSR as the row-direction address counter when reading out of the memory, thus avoiding the generation of an erroneous detection of synchronization in the synchronization detecting circuit 16.

Figure 3:
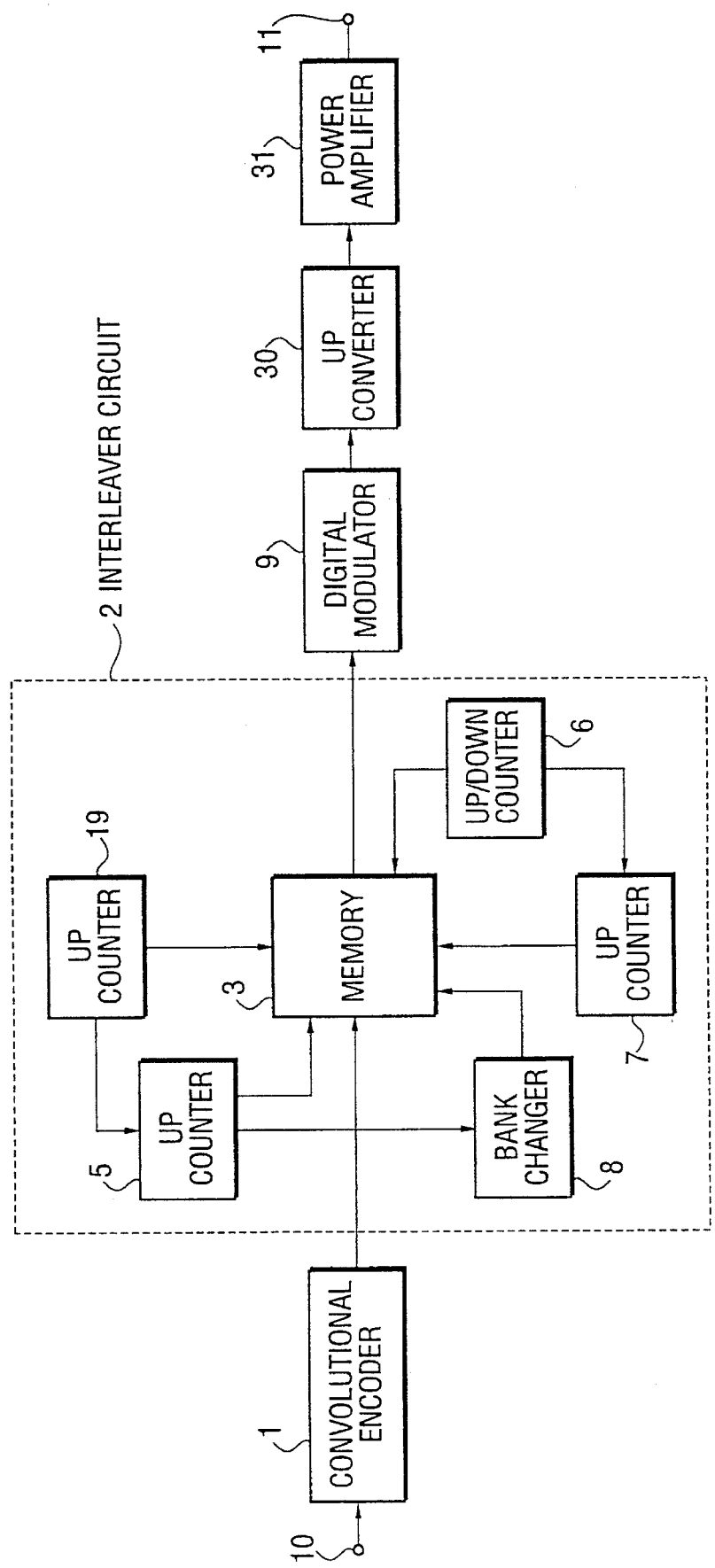
FIG. 3 is a block diagram of the forward error correcting transmitter in accordance with another embodiment of the present invention.
Figure 4:
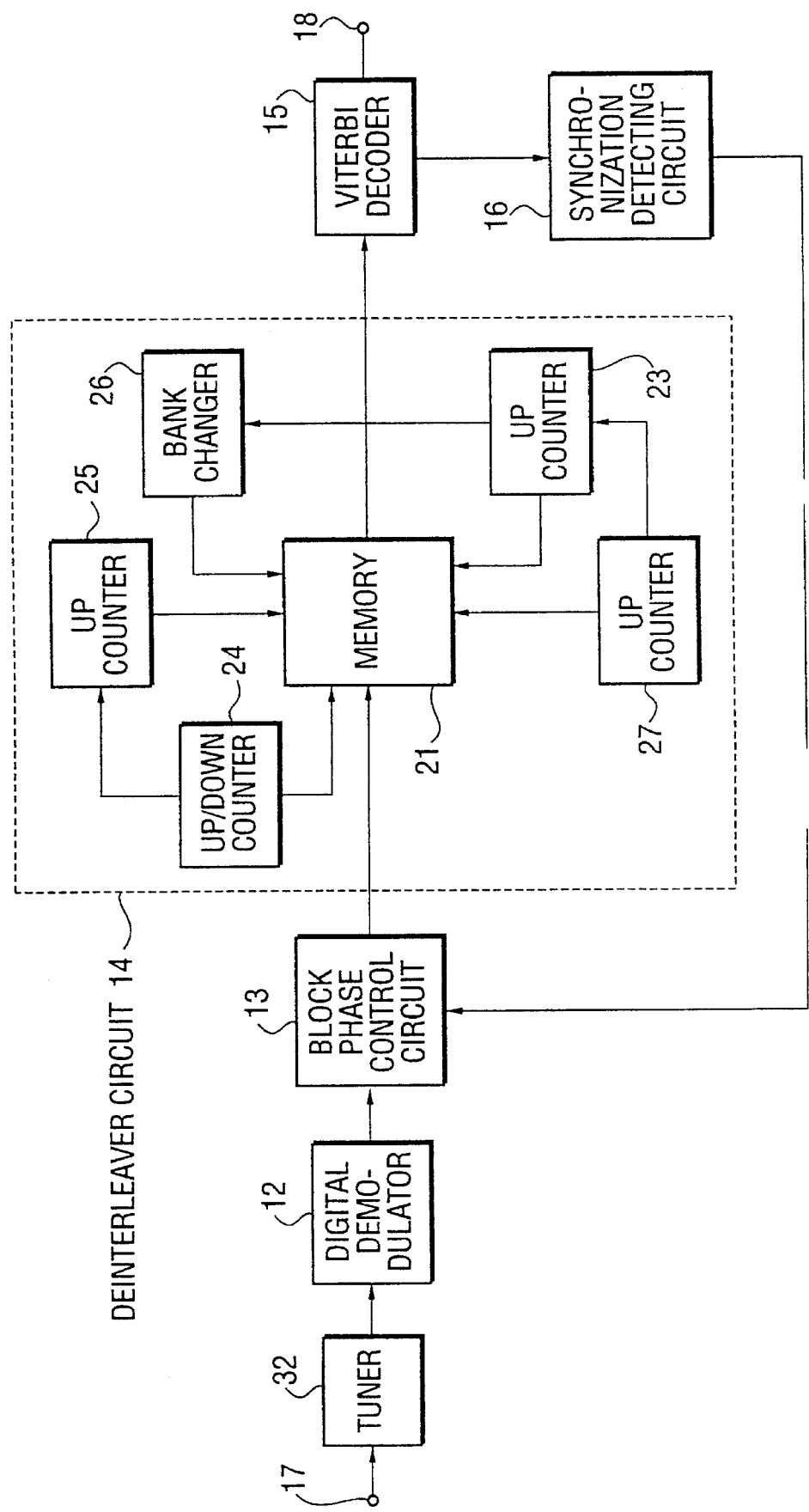
FIG. 4 is a block diagram of the forward error correcting receiver in accordance with another embodiment of the present invention.

Then, in the forward error correcting transmitter of an another embodiment, the row-direction address during writing into the memory 3 of the interleaver circuit 2 is given in succession in a single direction, and the column-direction address during reading is given by the up/down counter as in the above-mentioned embodiment (see FIG. 3). In the forward error correcting receiver, so as to correspond to the above, the column-direction address when writing into the memory 21 of the deinterleaver circuit 14 is given, as in the above-mentioned embodiment, by the use of the up/down counter, and the row-direction address is given in succession in a single direction (see FIG. 4). According to the configuration as described above, as shown in FIG. 6, when using the up/down counter as the column-direction counter during writing of the deinterleaver circuit 14, and using an ordinary up counter as the row-direction counter when reading out (the case of deinterleaving at a position off the proper data partition by one symbol, shown in FIG. 6 as in FIG. 8), the original data column is broken and diffused as a result of the deinterleaving, thus eliminating the possibility of erroneous detection of synchronization in the synchronization detecting circuit 16.

When deinterleaving is conducted at a position off the proper data partition by one column as in FIG. 5, use of the up/down counter as the column-direction counter during writing exerts no effect, and the original data column before interleaving is maintained to some extent, thus resulting in a higher possibility of erroneous detection of synchronization in the synchronization detecting circuit.

Although the LFSR has been used for generating random numbers in the above-mentioned embodiments, this is not limitative, but any other random number generator may be employed with the condition that the sequence of addresses corresponds between the interleaving side and the deinterleaving side.

While the above embodiment has had a configuration using the up counters 5 and 7 and the up counters 23 and 25, a configuration using down counters may be used. The bank changer in the above-mentioned embodiments has used a configuration in which the carry signal of the up counter 5 or 23 is entered, whereas it is also possible to adopt a configuration in which the carry signal of the up counter 7 or 25 is entered.

While the 2-port memory permitting simultaneous reading and writing has been used in the above embodiments, reading and writing may be conducted by time-sharing processing using a 1-port memory.

Although the two-dimensional memories have had 7×4 memory spaces in the above-mentioned embodiments, the memory size is not limited to this.

The interleaver circuit 2 and the deinterleaver 14 have been configured with special hardware in the above embodiments. However, the configuration is not limited to this, so the same function may be achieved in the form of computer software.

What is claimed is:

1. A forward error correcting transmitter which comprises:

an error correcting encoder, said error correcting encoder error-correcting-encoding a digital signal to obtain an error-correcting-encoded signal;

an interleaver comprising:

a memory, composed of rows and columns, for permitting the reading and writing of said error-correcting-encoded signal; and a memory controller, said memory controller controlling said memory, when writing in said memory, so as to write said error-correcting-encoded signal on a row by row basis in a predetermined random sequence in each row, and controls said memory, when reading out from said memory, so as to read out said error-correcting-encoded signal written in said memory in one direction in each column, alternately reversing the direction on a column by column basis;

a modulator, said modulator modulating said error-correcting-encoded signal read out from said memory to obtain a modulated signal; and a transmitter, said transmitter providing a transmitted signal from said modulated signal.

2. A forward error correcting transmitter as claimed in claim 1, wherein said predetermined random sequence is an M-series sequence.

3. A forward error correcting transmitter as claimed in claim 1, wherein said predetermined random sequence is continuous in one direction.

4. A forward error correcting receiver which comprises:

a receiver, said receiver receiving a transmitted signal;

a demodulator, said demodulator demodulating said transmitted signal to obtain an input signal;

an deinterleaver comprising:

a memory, composed of rows and columns, for permitting the reading and writing of said input signal; and a memory controller, said memory controller controlling said memory, when writing into said memory, so as to write said input signal in one direction in each column, alternately reversing the direction on a column by column basis, and controls said memory, when reading out from said memory, so as to read out said input signal on a row by row basis in a predetermined random sequence in each row;

an error correcting decoder, said error correcting decoder error-correcting-decoding said input read out from said memory; and a synchronization detector, said synchronization detector detecting the synchronization of said input signal to be error-correcting-decoded.

5. A forward error correcting receiver as claimed in claim 4, wherein said predetermined random sequence represents a maximum length shift register sequence.

6. A forward error correcting receiver as claimed in claim 4, wherein said predetermined random sequence is continuous in a single direction.

\* \* \* \* \*